United States Patent
Cho (10) Patent No.: US 8,553,456 B2
(45) Date of Patent: Oct. 8, 2013

(54) FLASH MEMORY DEVICE HAVING IMPROVED READ OPERATION SPEED

(75) Inventor: Ji-Ho Cho, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 714 days.

(21) Appl. No.: 12/768,055

(22) Filed: Apr. 27, 2010

(65) Prior Publication Data

US 2010/0277978 A1 Nov. 4, 2010

(30) Foreign Application Priority Data

Apr. 30, 2009 (KR) .................. 10-2009-0038352

(51) Int. Cl.
*G11C 11/34* (2006.01)
*G11C 16/04* (2006.01)

(52) U.S. Cl.
USPC .............. 365/185.03; 365/185.19; 365/185.2; 365/185.25

(58) Field of Classification Search
USPC .............. 365/185.03, 185.19–185.22, 185.25
See application file for complete search history.

(56) References Cited

U.S. PATENT DOCUMENTS

| | | | | |
|---|---|---|---|---|
| 6,075,722 A * | 6/2000 | Hibino | .......................... | 365/168 |
| 6,215,697 B1 * | 4/2001 | Lu et al. | .................... | 365/185.03 |
| 6,490,201 B2 * | 12/2002 | Sakamoto | ................ | 365/185.22 |
| 7,414,892 B2 * | 8/2008 | Honda et al. | ............. | 365/185.22 |
| 7,564,711 B2 * | 7/2009 | Mokhlesi | .................. | 365/185.03 |
| 2002/0145906 A1 * | 10/2002 | Einaga et al. | .............. | 365/185.2 |
| 2003/0112664 A1 | 6/2003 | Yamano | | |
| 2004/0196712 A1 | 10/2004 | Homma et al. | | |
| 2006/0083070 A1 | 4/2006 | Arakawa | | |

FOREIGN PATENT DOCUMENTS

| | | | |
|---|---|---|---|
| JP | 2001344983 A | 12/2001 | |
| JP | 2003187587 A | 7/2003 | |
| JP | 2006114154 A | 4/2006 | |
| KR | 1020010110068 A | 12/2001 | |
| KR | 1020030051286 A | 6/2003 | |

* cited by examiner

*Primary Examiner* — Harry W Byrne
*Assistant Examiner* — Lance Reidlinger
(74) *Attorney, Agent, or Firm* — Volentine & Whitt, PLLC (57) ABSTRACT

Provided is a flash memory device. The flash memory device includes: a memory cell storing multi-bit data; a reference bias voltage supply circuit generating a reference bias voltage; an sense amplifier sensing the multi-bit data stored in the memory cell using the reference bias voltage; and a control circuit controlling the reference bias voltage supply circuit. The control circuit controls the reference bias voltage supply circuit to allow the reference bias voltage to be developed according to a change of a main word line voltage applied to the memory cell during a read operation.

10 Claims, 7 Drawing Sheets

FLASH MEMORY DEVICE HAVING IMPROVED READ OPERATION SPEED

CROSS-REFERENCE TO RELATED APPLICATIONS

This U.S. non-provisional patent application claims priority under 35 U.S.C. §119 to Korean Patent Application No. 10-2009-0038352, filed on Apr. 30, 2009, the subject matter of which is hereby incorporated by reference.

BACKGROUND

The present disclosure relates to semiconductor memory devices, and more particularly to a flash memory devices.

Semiconductor memory devices include Random Access Memory (RAM) and Read Only Memory (ROM). The RAM is volatile memory that loses stored data in the absence of applied power. The ROM is non-volatile memory that retains stored data in the absence of applied power. The RAM includes Dynamic RAM (DRAM), Static RAM (SRAM), etc. The ROM includes Programmable ROM (PROM), Erasable PROM (EPROM), Electrically EPROM (EEPROM), etc. Flash memory is a particular type of EEPROM and is conventionally classified into as NAND type or NOR type. NOR flash memory is commonly used to store code and generally operates faster that NAND flash memory. Accordingly, NOR flash memory is often used in sophisticated electronic devices, such as contemporary mobile phones, that require high-speed data processing.

Some forms of flash memory include single level memory cells using a program and an erase state to store binary data per each memory cell. Other forms of flash memory include multi-level memory cells capable of storing 2 or more data bits per memory cell.

Like many other memory device types, flash memory uses a sense amplifier to read stored data from selected memory cell(s). In general, a sense amplifier "senses" data stored in a selected memory cell by comparing an amount of a current flowing through the selected memory cell with a reference current. In order to generate this reference current, many flash memory devices come equipped with a so-called "reference memory cell".

In order to read the current programmed state of a multi-level memory cell, a flash memory device usually applies a sequentially increasing word line voltage to a selected memory cell. The flash memory device applies this type of word line voltage to both the selected memory cell and the reference memory cell to sense data stored in the selected memory cell. Here, the word line voltage applied to the selected memory cell is termed "a main word line voltage", and the word line voltage applied to the reference memory cell is alternately termed "a reference word line voltage".

In a conventional flash memory device, the main word line voltage is increased sequentially, but the reference word line voltage is maintained at a predetermined level once it is increased. Using this comparative approach, the reading of a multi-level memory cell in a flash memory device usually requires a defined interval of time referred to as "a develop interval" during which the main word line voltage is increased. Thus, during a read operation the flash memory device senses data stored in a memory cell during an interval wherein the main word line voltage is maintained at a predetermined level following the develop interval for the main word line voltage.

SUMMARY

The present disclosure provides a flash memory device characterized by improved reading speed.

Embodiments of the inventive concept provide flash memory devices including: a memory cell array including a multi-level memory cell storing data; a reference bias voltage supply circuit configured to generate a reference bias voltage; an sense amplifier configured to sense the data stored in the memory cell in relation to the reference bias voltage; and a control circuit configured to control operation of the reference bias voltage supply circuit, such that the reference bias voltage is developed in accordance with a change in a main word line voltage applied to the memory cell during a read operation.

In a related aspect, the read operation may include a plurality of enable sub-intervals, the main word line voltage may be applied to the memory cell during each one of the plurality of enable sub-intervals, and at least one of the plurality of enables sub-intervals may comprise a discharge sub-interval.

In another related aspect, the control circuit may be further configured to control operation of the reference bias voltage supply circuit to discharge the reference bias voltage to a predetermined level during the discharge sub-interval.

In yet another related aspect, the plurality of enable sub-intervals may comprise sequentially occurring first, second and third enable sub-intervals, and the first and second enable sub-intervals may include respectively a first discharge sub-interval and a second discharge sub-interval.

In yet another related aspect, the control circuit may be further configured to control operation of the reference bias voltage supply circuit such that the predetermined level of the reference bias voltage discharged during the discharge sub-interval is subsequently increased in accordance with a change in the voltage level of the main word line during a next enable sub-interval following the discharge sub-interval.

In still anther related aspect, the reference bias voltage supply circuit may comprise: a reference memory cell; a reference word line voltage supply circuit configured to supply a reference word line voltage to a gate of the reference memory cell; and a reference bias voltage generation circuit connected to a drain of the reference memory cell and configured to generate the reference bias voltage, wherein the reference word line voltage supply circuit comprises a discharge circuit configured to discharge the reference word line voltage during the discharge sub-interval, and a level of the reference bias voltage is changed in accordance with a change in a level of the reference word line voltage.

In still anther related aspect, the reference bias voltage supply circuit may comprise: a reference memory cell; a reference word line voltage supply circuit configured to apply a reference word line voltage to a gate of the reference memory cell; and a reference bias voltage generation circuit connected to a drain of the reference memory cell and configured to generate the reference bias voltage, wherein the reference bias voltage generation circuit comprises a discharge circuit configured to discharge the reference bias voltage during the discharge sub-interval.

Embodiments of the inventive concept provide a method of reading multi-level data from a selected memory cell in a flash memory device, the method comprising: applying a main word voltage to the selected memory cell during a read operation, wherein the main word line voltage is sequentially increased during each one of a plurality of enable sub-intervals; generating a reference bias voltage, wherein the reference bias voltage is repeatedly developed at a predetermined level in accordance with an increase in the main word line voltage during each one of the plurality of sub-intervals; and sensing the multi-level data stored in the selected memory cell using the reference bias voltage during each one of a plurality of data sense sub-intervals occurring during a respective one of the plurality of enable sub-intervals.

In a related aspect, the method may further comprise; during each one of the plurality of data sense sub-intervals, latching the sensed multi-level data.

In another related aspect, the method may further comprise; following at least one of the plurality of data sense sub-intervals, discharging the reference bias voltage from the predetermined level down to a discharge level during a discharge sub-interval.

In another related aspect, the method may further comprise; following the discharge sub-interval, re-developing the reference bias voltage at the predetermined level during a next enable sub-interval in the plurality of enable sub-intervals.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Hereinafter, exemplary embodiments of the inventive concept will be described below in some additional detail with reference to the accompanying drawings. It should be noted however that the inventive concept may be variously embodied, and the scope of the inventive concept in not limited to only the illustrated embodiments.

The illustrated embodiments of the inventive concept are drawn to a NOR flash memory device as one possible example. The exemplary NOR flash memory device is assumed to use conventionally understood techniques for programming and reading multi-bit data in each memory cell to provide a large data storage capacity per unit surface area occupied by the memory device.

Figure 1:
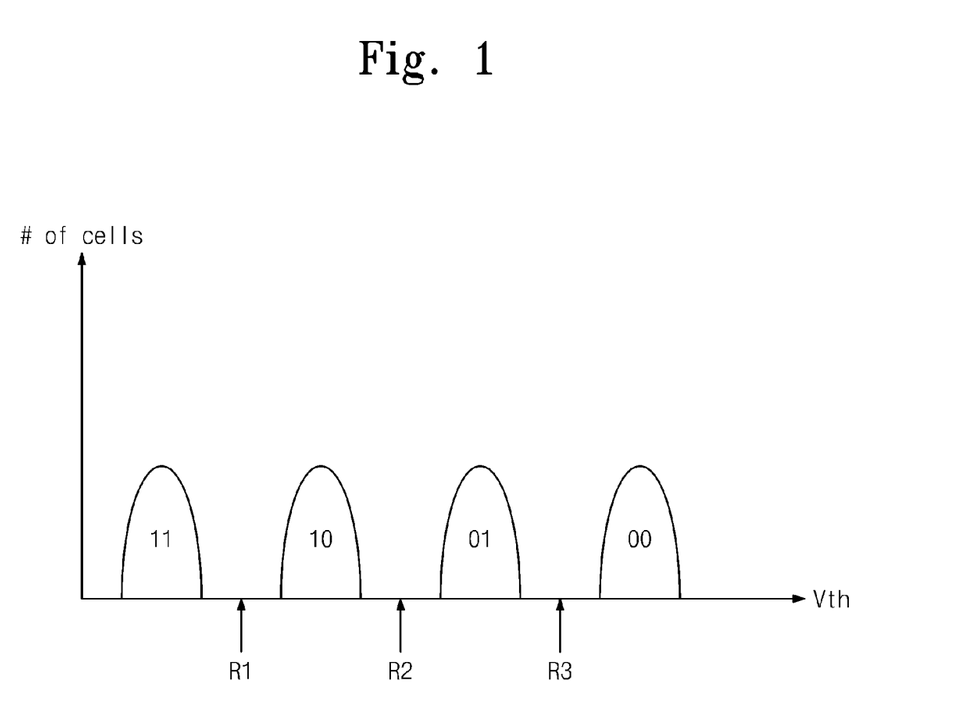
FIG. 1 is a view illustrating threshold voltage distributions for a multi-level memory cell according to an embodiment of the inventive concept.

FIG. 1 is a conceptual diagram illustrating threshold voltage distributions for the memory cells of a NOR flash memory device according to an embodiment of the inventive concept.

Referring to FIG. 1, the threshold voltage distributions for the memory cell respectively define one of four data states assigned as 11, 10, 01, and 00.

In order to read a particular data state for a selected memory cell, the NOR flash memory device sequentially increases the word line voltage applied to the selected memory cell. For example, when a first word line voltage R1 is applied to a memory cell, it may be determined that the memory cell is in an ON state, or that memory cell is in the 11 state. A memory cell may be determined to be in an OFF state when the first word line voltage R1 is applied to it and the memory cell is determined to be ON when the second word line voltage R2 is applied to a memory cell, or that the memory cell is in the 10 state. In addition, if the memory cell is determined to be OFF when the second word line voltage R2 is applied to it and the memory cell is determined to be ON when a third word line voltage R3 higher than the second word line voltage R2 is applied to the memory, or that the memory cell is in the 01 state. When the third word line voltage R3 is applied to the memory, the memory cell is determined to be OFF, or that the memory cell is in the 00 state.

There is a voltage difference of predetermined size between each on of the plurality of word line voltages R1, R2, and R3. A read operation includes a plurality of word line enable intervals, and a word line voltage corresponding to each of the word line voltage enable intervals is applied to a memory cell. Here, the word line voltage enable interval includes a develop interval. The develop interval is an interval (e.g., a voltage increasing interval) where a word line voltage is increased, and the word line voltage is increased up to a required level of each of the word line enable intervals at a develop interval.

Figure 2:
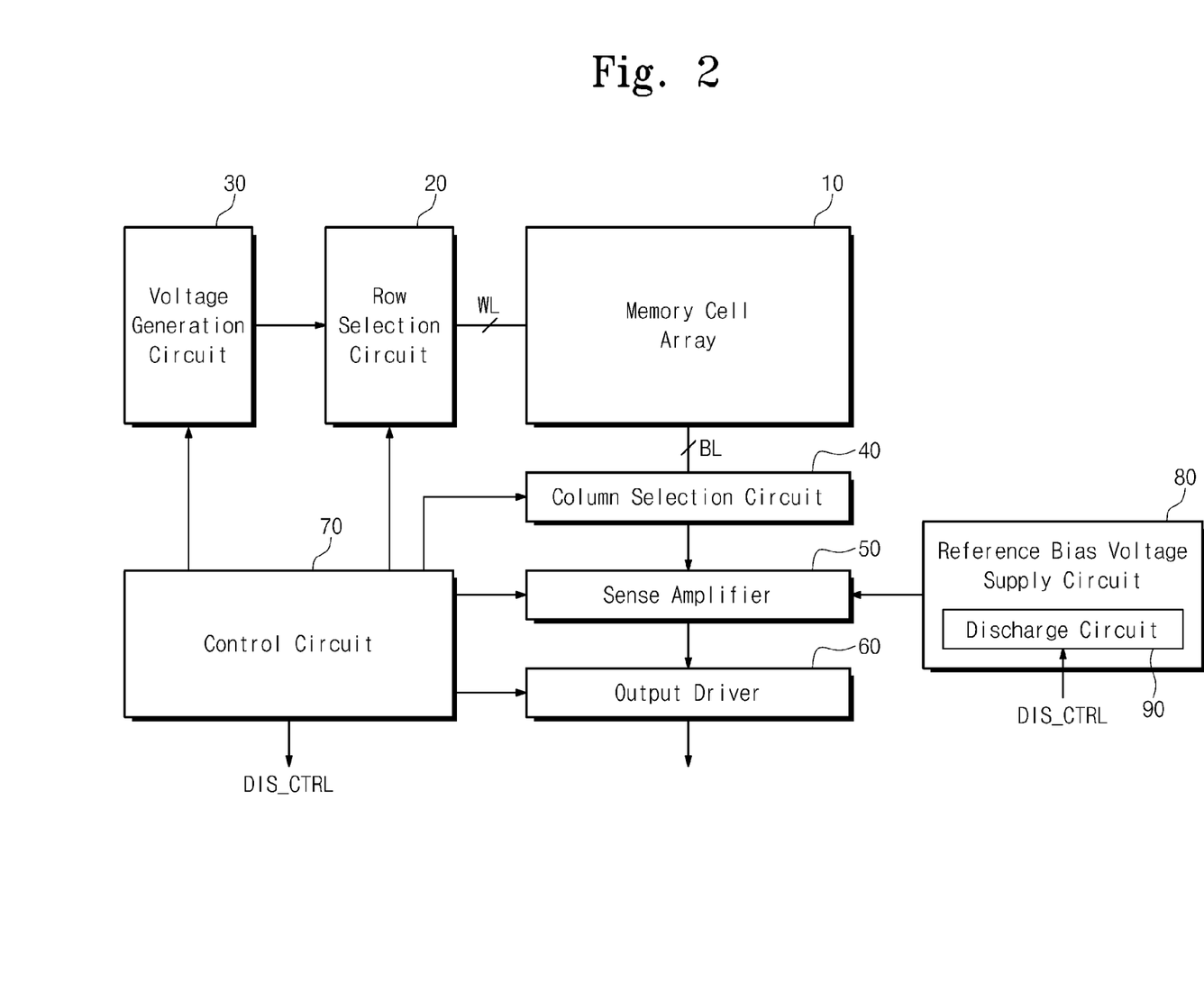
FIG. 2 is a block level diagram illustrating a NOR flash memory device according to an embodiment of the inventive concept.

FIG. 2 is a block level diagram illustrating a NOR flash memory device according to an embodiment of the inventive concept.

Referring to FIG. 2, the NOR flash memory device comprises a memory cell array 10, a row selection circuit 20, a voltage generation circuit 30, a column selection circuit 40, a sense amplifier 50, an output driver 60, a control circuit 70, and a reference bias voltage supply circuit 80. The reference bias voltage supply circuit 80 includes a discharge circuit 90.

The memory cell array 10 includes a plurality of memory cells arranged on intersection regions of rows and columns.

The row selection circuit 20 is controlled by the control circuit 70 and selects one row of the memory cell array 10 in response to row address information provided from the external. Additionally, the row selection circuit 20 applies a word line voltage generated in the voltage generation circuit 30 to the selected word line. Here, the word line voltage applied to one row of the memory cell array 10 (i.e., the word line voltage applied to a memory cell) is called a main word line voltage.

The column selection circuit 40 is controlled by the control circuit 70 and selects columns of the memory cell array 10 in response to column address information provided from the external.

The sense simplifier 50 is controlled by the control circuit 70, and senses and amplifies data stored in the memory cell selected by the row selection circuit 20 and the column selection circuit 30.

The output driver 60 is controlled by the control circuit, and outputs data sensed by the sense amplifier 50 during a read operation.

The reference bias voltage supply circuit 80 includes a reference memory cell. The reference bias voltage supply circuit 80 applies a word line voltage to a reference memory cell to generate a reference bias voltage. The word line voltage applied to the reference memory cell is called a reference word line voltage.

A reference bias voltage generated in the reference bias voltage supply circuit 80 is inputted to the sense amplifier 50, and the sense amplifier 50 generates a reference current in response to the reference bias voltage when data stored in the memory cell are sensed.

The reference bias voltage supply circuit 80 generates a reference bias voltage that can be sensed at a develop interval during a read operation. The reference bias voltage supply circuit 80 controls a reference bias voltage to be discharged to a predetermined level at a discharge interval. The discharge interval starts with a point where a latch ends at an enable interval of a main word line voltage to a point where an enable interval of the next main word line voltage starts. Through the discharge interval, the reference bias voltage has the same voltage slope as the main word line voltage at the develop interval of the main word line voltage. This means that it is possible to sense a state of a memory cell through the sense amplifier 50 at the develop interval.

The reference bias voltage supply circuit 80 includes the discharge circuit 90 to discharge the reference bias voltage. The discharge circuit 90 discharges one of the reference bias voltage or the reference word line voltage.

The control circuit 70 controls general operations related to program, erase, and read operations of the NOR flash memory device. The control circuit 70 generates a discharge control signal to control a discharge operation.

The sense amplifier 50 uses a reference bias voltage provided from the reference bias voltage supply circuit 80 to perform a sense operation.

Figure 3:
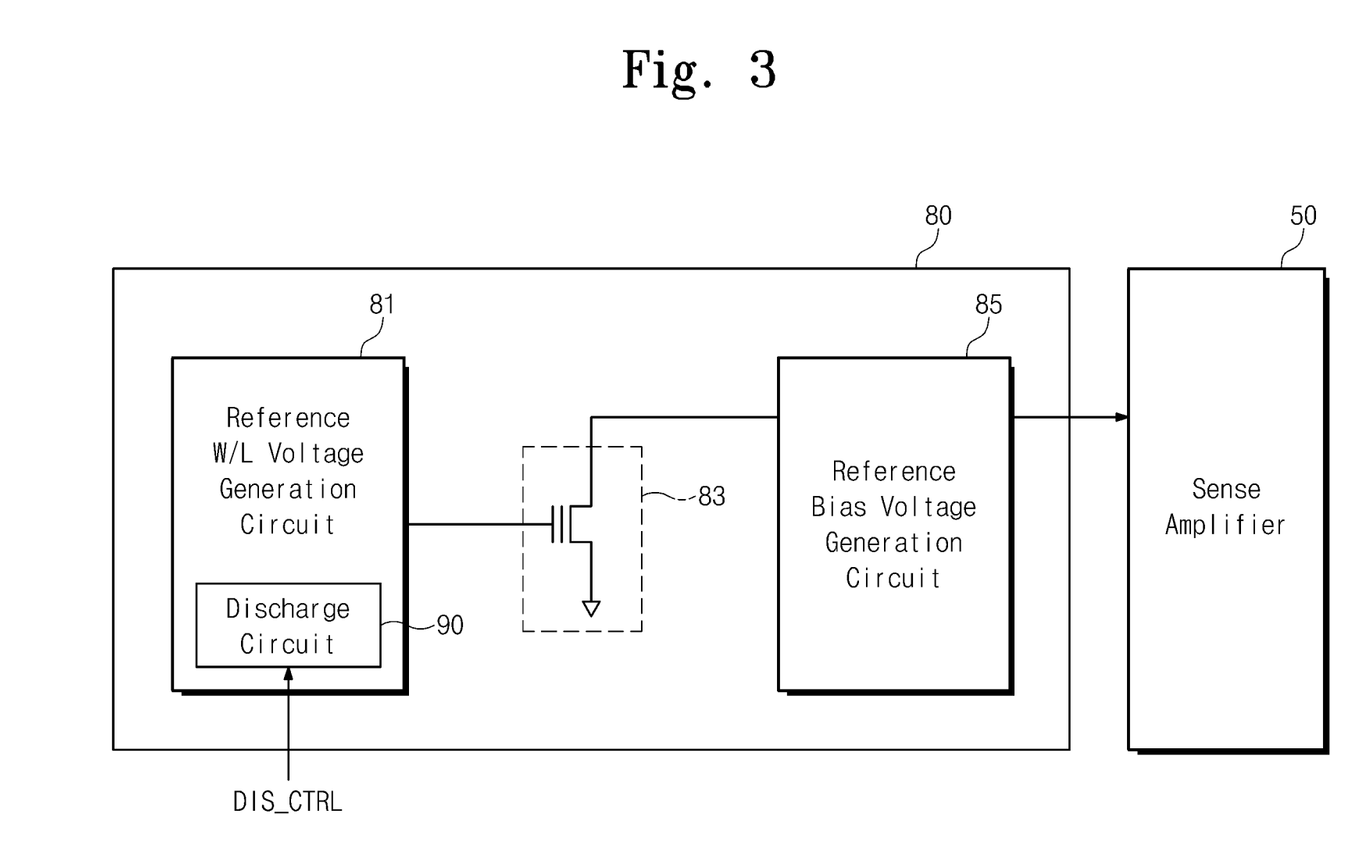
FIG. 3 is a block level diagram further illustrating the reference bias voltage supply circuit of FIG. 2 according to one embodiment of the inventive concept.

FIG. 3 is a block level diagram further illustrating the reference bias voltage supply circuit of FIG. 2 according to one possible embodiment of the inventive concept.

Referring to FIG. 3, the reference bias voltage supply circuit 80 comprises a reference word line voltage generation circuit 81, a reference memory cell 83, and a reference bias voltage generation circuit 85.

A gate of the reference memory cell 83 is connected to the reference word line voltage generation circuit 81, and a drain of the reference memory cell 83 is connected to the reference bias voltage generation circuit 85, and a source of the reference memory cell 83 is grounded.

The reference word line voltage corresponding to one of the main word line voltages R1, R2, and R3 is applied to the reference memory cell 83.

The reference word line voltage generation circuit 81 includes a discharge circuit 90. The discharge circuit 90 operates in response to a discharge control signal DIS_CTRL, and discharges a reference word line voltage generated from the reference word line voltage generation circuit 81 at a discharge interval. The discharge circuit 90 discharges the reference word line voltage to a predetermined voltage level.

Then, when a discharge interval ends (i.e., the next word line voltage enable interval starts), the discharged reference word line voltage is increased.

The reference word line voltage generated in the reference word line voltage generation circuit 81 is outputted to the gate of the reference memory cell 83.

The reference bias voltage generation circuit 85 is connected to the drain of the reference memory cell 83 to generate a reference bias voltage. Like the reference word line voltage, the reference bias voltage is changed through a discharge interval and a develop interval according to a change of the reference word line voltage. That is, the reference bias voltage is decreased to a predetermined voltage level at a discharge interval, and is increased to a target level at a develop interval.

Figure 4:
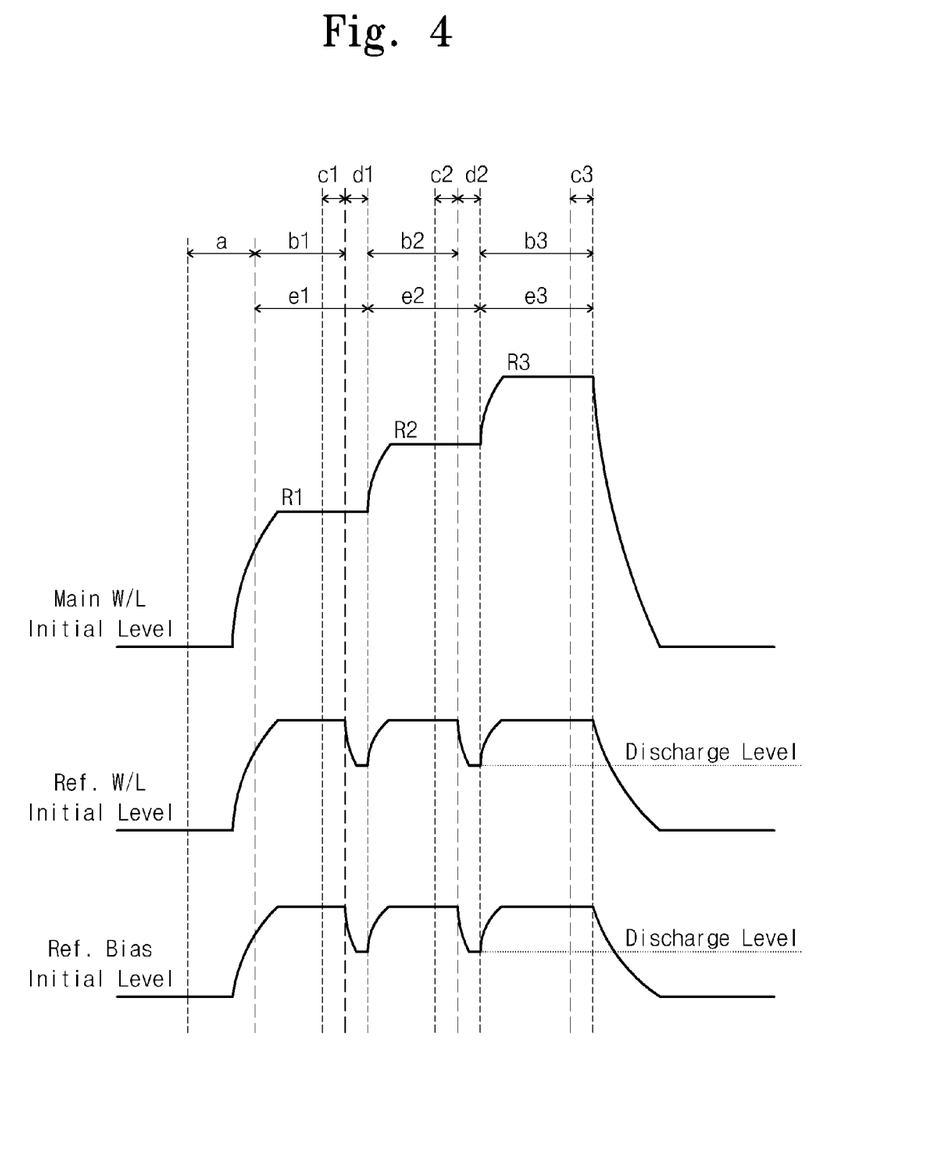
FIG. 4 is a voltage waveform diagram further illustrating the operation of the reference bias voltage supply circuit of FIG. 3.

FIG. 4 is a waveform diagram further illustrating the operation of the reference bias voltage supply circuit of FIG. 3. A main word line voltage, a reference word line voltage, and a reference bias voltage are illustrated in FIG. 4.

The main word line voltage is a word line voltage applied to the word line of a selected memory cell in a memory cell array. The reference word line voltage is a word line voltage applied to the reference memory cell 83 in the reference bias voltage generation circuit 85.

In addition, the reference bias voltage is generated using a current flowing through the reference memory cell 83 controlled by the reference word line voltage. The reference bias voltage is a voltage provided to the sense amplifier 50 to sense a state of a memory cell.

An interval "a" is a pre-charge interval for the word line voltage. During the pre-charge interval, the main word line and the reference word line are pre-charged with a main word line voltage and a reference word line voltage, respectively.

During interval "a", the reference word line voltage generation circuit 81 pre-charges the reference word line with the reference word line voltage. Additionally, according to the pre-charge level of the reference word line voltage, the reference bias voltage is provided to the sense amplifier 50 through the reference bias voltage generation circuit 85.

An interval "b", inclusive of sub-intervals b1, b2, and b3, a data sense interval within the sense amplifier 50, (i.e., a read operation interval). The data sense interval includes the develop interval for the main word line. For one example, the develop interval at sub-interval b2 is an interval wherein the main word line voltage is increased from a first main word line voltage R1 to a second main word line voltage R2.

During the interval "b", the reference word line voltage generation circuit 81 increases the reference word line voltage by a predetermined reference word line voltage.

During the sub-interval b1, the second word line voltage generation circuit 81 increases the pre-charge voltage level to a predetermined reference word line voltage. During sub-interval b1, the reference bias voltage generation circuit 85 increases the pre-charge voltage level to a predetermined reference bias voltage level according to a change in the reference word line voltage. During the sub-intervals b2 and b3, the reference word line voltage generation circuit 81 increases a voltage discharged at a previous interval to a predetermined reference word line voltage. During the sub-intervals b2 and b3, the reference bias voltage generation circuit 85 increases a discharged voltage of a predetermined discharge level into a predetermined reference bias voltage according to a change of a reference word line voltage.

Sub-intervals b1, b2 and b3 include respective develop intervals for the reference word line voltage like the develop intervals for the main word line and reference bias voltage.

During the sub-intervals b1, b2 and b3, the reference word line voltage and the reference bias voltage are increased to the predetermined reference word line voltage and the predetermined reference bias voltage, respectively. Accordingly, during the sub-intervals b1, b2, and b3, data stored in the selected memory cell may be sensed.

An interval "c", inclusive of sub-internals c1, c2, and c3, is a latch interval for the data sensed during the sense interval "b". Thus, in certain embodiments of the inventive concept, the latch interval "c" may be included (or partitionally included) within the data sense interval "b". During the interval "c", the reference word line voltage generation circuit 81 generates a predetermined reference word line voltage, and the reference bias voltage generation circuit 85 generates a predetermined reference bias voltage.

An interval "d", inclusive of sub-intervals d1 and d2, is a discharge interval. Each discharge sub-interval is an interval occurring between the end of a preceding latch sub-interval (c1, c2) and the beginning of a next enable interval (e2, e3). (See, below). During the discharge interval "d", the reference word line voltage generation circuit 81 discharges the reference word line voltage to a predetermined discharge level through the discharge circuit 90. The reference bias voltage generation circuit 85 generates a reference bias voltage, which is discharged according to discharge of a reference word line voltage.

An interval "e", inclusive of sub-intervals e1, e2, and e3, is an enable interval for the word line voltage. The sub-intervals e1, e2, and e3 are intervals wherein the main word line voltages R1, R2, and R3 are respectively enabled. Each enable sub-interval includes a develop interval for the main word line voltage, reference word line voltage, and reference bias voltage.

In a flash memory device according to an embodiment of the inventive concept, it is assumed that the main word line voltage is increased sequentially, and as a result, during a develop interval, current flowing through a memory cell is increased from a first current to a second current.

A case in which the main word line voltage is increased from the first main word line voltage R1 to the second main word line voltage R2 will be described, as an example. The current flowing through a memory cell is thus assumed to have a first current value before the develop interval, and an increased second current value after the develop interval. Hence, the first current is less than the second current.

The sense amplifier 50 generates a reference current using the reference bias voltage. The reference bias voltage is discharged during the discharge interval and is developed during the develop interval. The reference current does not maintain the value of the second current, but is increased from the first current to a second current through discharge of the reference bias voltage.

The sense amplifier 50 can sense data at a develop interval because a current of a memory cell and a reference current are similarly changed.

Figure 5:
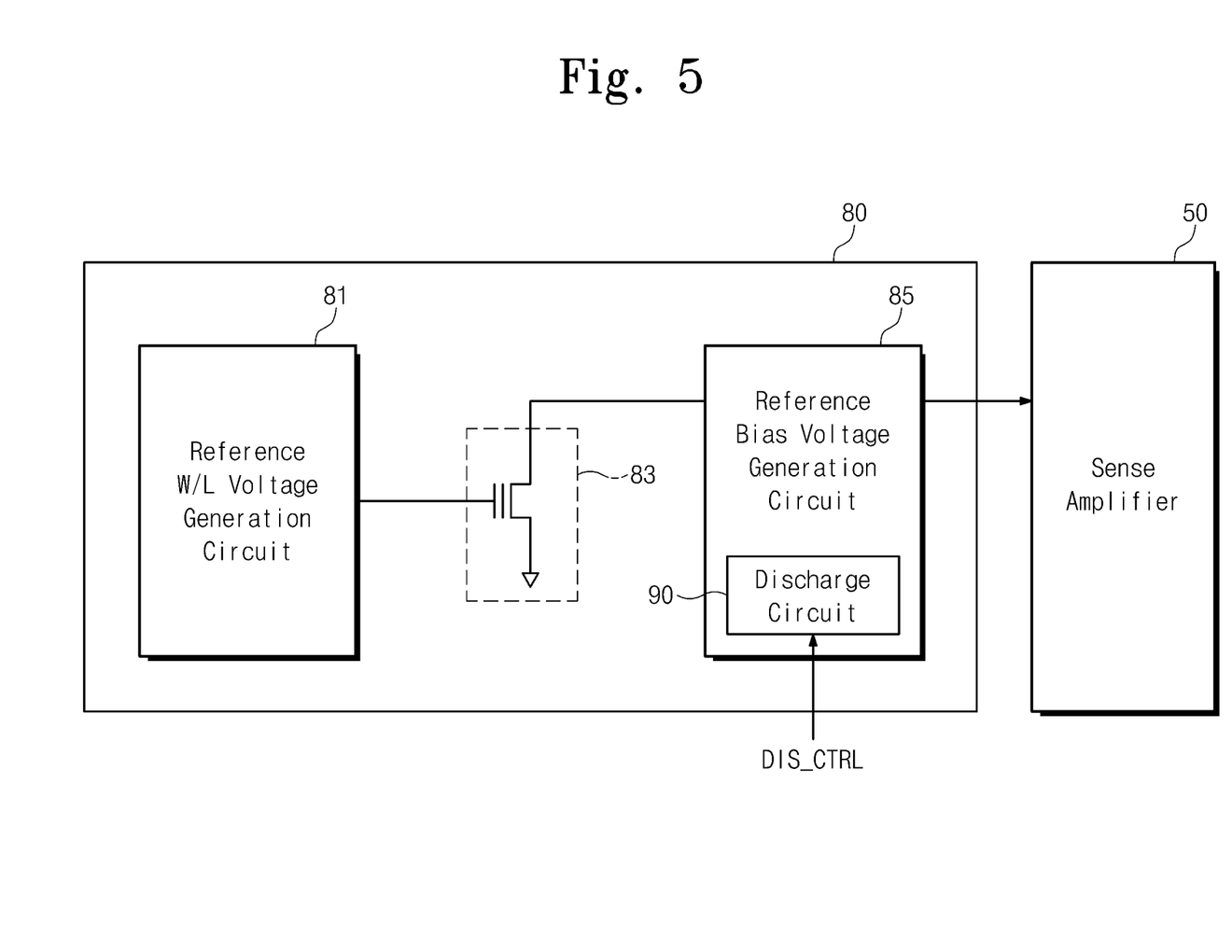
FIG. 5 is a block level diagram further illustrating the reference bias voltage supply circuit of FIG. 2 according to another embodiment of the inventive concept.

FIG. 5 is block level diagram further illustrating the reference bias voltage supply circuit of FIG. 2 according to another embodiment of the inventive concept.

Referring to FIG. 5, the reference bias voltage supply circuit 80 comprises a reference word line voltage generation circuit 81, a reference memory cell 83, and a reference bias voltage generation circuit 85.

A gate of the reference memory cell 83 is connected to the reference word line voltage generation circuit 81, and a drain of the reference memory cell 83 is connected to the reference bias voltage generation circuit 85, and a source of the reference memory cell 83 is grounded.

A reference word line voltage corresponding to one of main word line voltages R1, R2, and R3 is applied to the reference memory cell 83.

The reference word line voltage generation circuit 81 generates the reference word line voltage and outputs it to the gate of the reference memory cell 83.

The reference bias voltage generation circuit 85 includes a discharge circuit 90. The discharge circuit 90 operates in response to a discharge control signal DIS_CTRL, and discharges the reference bias voltage during a discharge interval through the reference word bias voltage generation circuit 85.

The discharge circuit 90 connects a plurality of transistors in parallel to discharge the reference bias voltage, or discharge the reference bias voltage through a transistor of predetermined size. The gate of the transistor in the discharge circuit 90 is controlled by the reference bias voltage, its drain is connected to the sense amplifier 50, and its source is grounded.

The discharge circuit 90 discharges the reference bias voltage to a predetermined voltage level.

In addition, once a discharge interval is finished (i.e., the next word line voltage enable interval starts), the discharged reference bias voltage is increased.

The reference bias voltage generated in the reference bias voltage generation circuit 85 includes a discharge interval due to the reference word line voltage, and is developed during a develop interval for the main word line.

Figure 6:
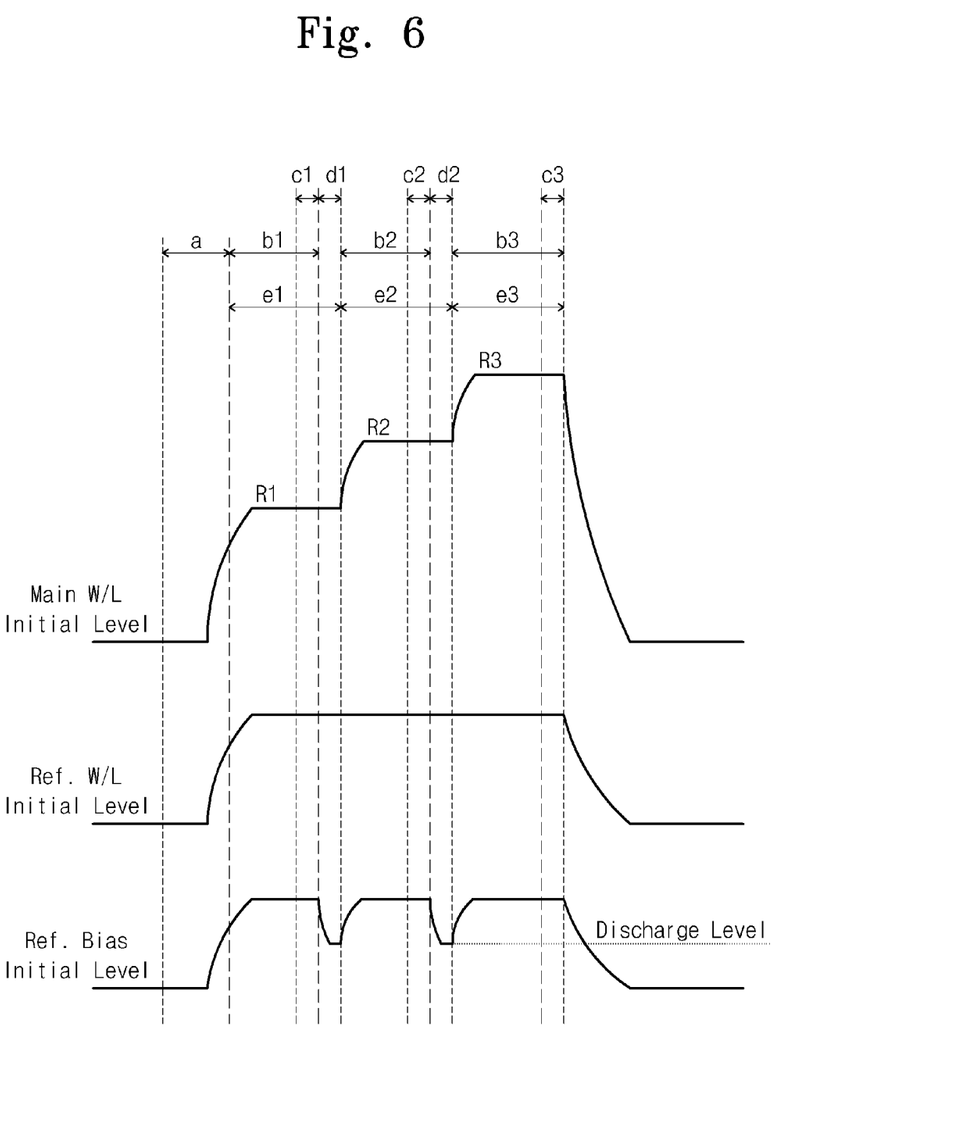
FIG. 6 is a voltage waveform diagram further illustrating the operation of the reference bias voltage supply circuit of FIG. 5.

FIG. 6 is a waveform diagram further illustrating operation of the reference voltage supply circuit of FIG. 5. The main word line voltage, reference word line voltage, and reference bias voltage are illustrated in FIG. 6.

The main word line voltage is a word line voltage applied to the word line connecting a selected memory cell. The reference word line voltage is a word line voltage applied to the reference memory cell 83 included in a reference bias voltage generation circuit 85.

In addition, the reference bias voltage is generated using a current flowing through the reference memory cell 83 controlled by the reference word line voltage. The reference bias voltage is a voltage provided to the sense amplifier 50 to sense a state of a memory cell.

An interval "a" is a pre-charge interval for the word line voltage. During the pre-charge interval "a", the main word line and reference word line are pre-charged with a main word line voltage and a reference word line voltage, respectively.

During the precharge interval "a", a reference word line voltage generation circuit 81 pre-charges a reference word line with a reference word line voltage. Additionally, according to the pre-charge of the reference word line voltage, a reference bias voltage is provided to the sense amplifier 50 through the reference bias voltage generation circuit 85.

An interval "b", inclusive of sub-intervals b1, b2, and b3, is a data sense interval for the sense amplifier 50, (i.e., a read operation interval). The data sense interval "b" includes a develop interval for the main word line. For example, during the sub-interval b2, a develop interval is an interval wherein the main word line voltage is increased from a first main word line voltage R1 to a second main word line voltage R2.

During the data sense interval "b", the reference word line voltage generation circuit 81 increases a reference word line voltage to a predetermined reference word line voltage.

During the sub-interval b1, the reference word line voltage generation circuit 81 increases a discharge voltage of a predetermined level to a predetermined reference word line voltage. During the sub-interval b1, the reference bias voltage generation circuit 85 increases the pre-charge voltage of a predetermined level to the predetermined reference bias voltage according to a change of the reference word line voltage. During the sub-intervals b2 and b3, the reference word line voltage generation circuit 81 maintains a predetermined reference word line voltage. During the sub-intervals b2 and b3, the reference bias voltage generation circuit 85 increases the discharged voltage of a predetermined discharge level into a predetermined reference bias voltage.

The sub-intervals b1, b2 and b3 include a develop interval for the reference bias voltage like the develop interval for the main word line.

During the sub-intervals b1, b2 and b3, the reference word line voltage and reference bias voltage are increased to a predetermined reference word line voltage and a predetermined reference bias voltage, respectively. Accordingly, data stored in the selected memory cell may be sensed during the sub-intervals b1, b2 and b3.

An interval "c", inclusive of sub-intervals c1, c2, and c3, is a latch interval for the data sensed during the data sense interval "b". In certain embodiments of the inventive concept the latch interval "c" may be included (or partitionally included) in the data sense interval "b". During the latch interval "c", the reference word line voltage generation circuit 81 generates a predetermined reference word line voltage, and the reference bias voltage generation circuit 85 generates a predetermined reference bias voltage.

An interval "d", inclusive of sub-intervals d1 and d2, is a discharge interval. The discharge interval "d" is an interval beginning at the end of a current latch sub0interval and ending at the beginning of a next enable interval. During the latch interval "d", the reference word line voltage generation circuit 81 discharges the reference word line voltage to the predetermined discharge level through the discharge circuit 90. The reference bias voltage generation circuit 85 generates a reference bias voltage, which is discharged according to the discharge of a reference word line voltage.

The interval "e", inclusive of sub-intervals e1, e2, and e3, is an enable interval for the word line voltage. The sub-intervals e1, e2, and e3 are intervals where main word line voltages R1, R2, and R3 are enabled. Each enable sub-interval includes a develop interval for the main word line voltage, reference word line voltage, and reference bias voltage.

A main word line voltage is sequentially increased in a flash memory device. A current flowing through a memory cell is increased from a first current to a second current at a develop interval.

One example in which a main word line voltage is increased from a first main word line voltage R1 to a second main word line voltage R2 is described. A current flowing through a memory cell has a value of a first current before a develop interval and is increased from the first current to the second current at a develop interval. The first current is less than the second current.

The sense amplifier 50 generates a reference current using a reference bias voltage. The reference bias voltage is discharged at a discharge interval, and is developed at a develop interval. The reference current does not maintain a value of a second current and is increased from the first current to the second current through discharge of a reference bias voltage.

The sense amplifier 50 can sense data at a develop interval because a current of the memory cell and a reference current are changed similarly.

Certain embodiments of the inventive concept can sense data during a develop interval for the main word line, such that the range of data sensing intervals (or sub-intervals) may be increased. If the data sensing interval may generally be increased as described above, the overall operating speed for the incorporating flash memory device may be improved.

FIGS. 3 and 5 illustrate selected examples wherein a reference memory cell 83 is used in the reference bias voltage supply circuit 60. However, other examples might be configured with multiple (e.g., three) reference memory cells generating voltages R1, R2, and R3, respectively.

Figure 7:
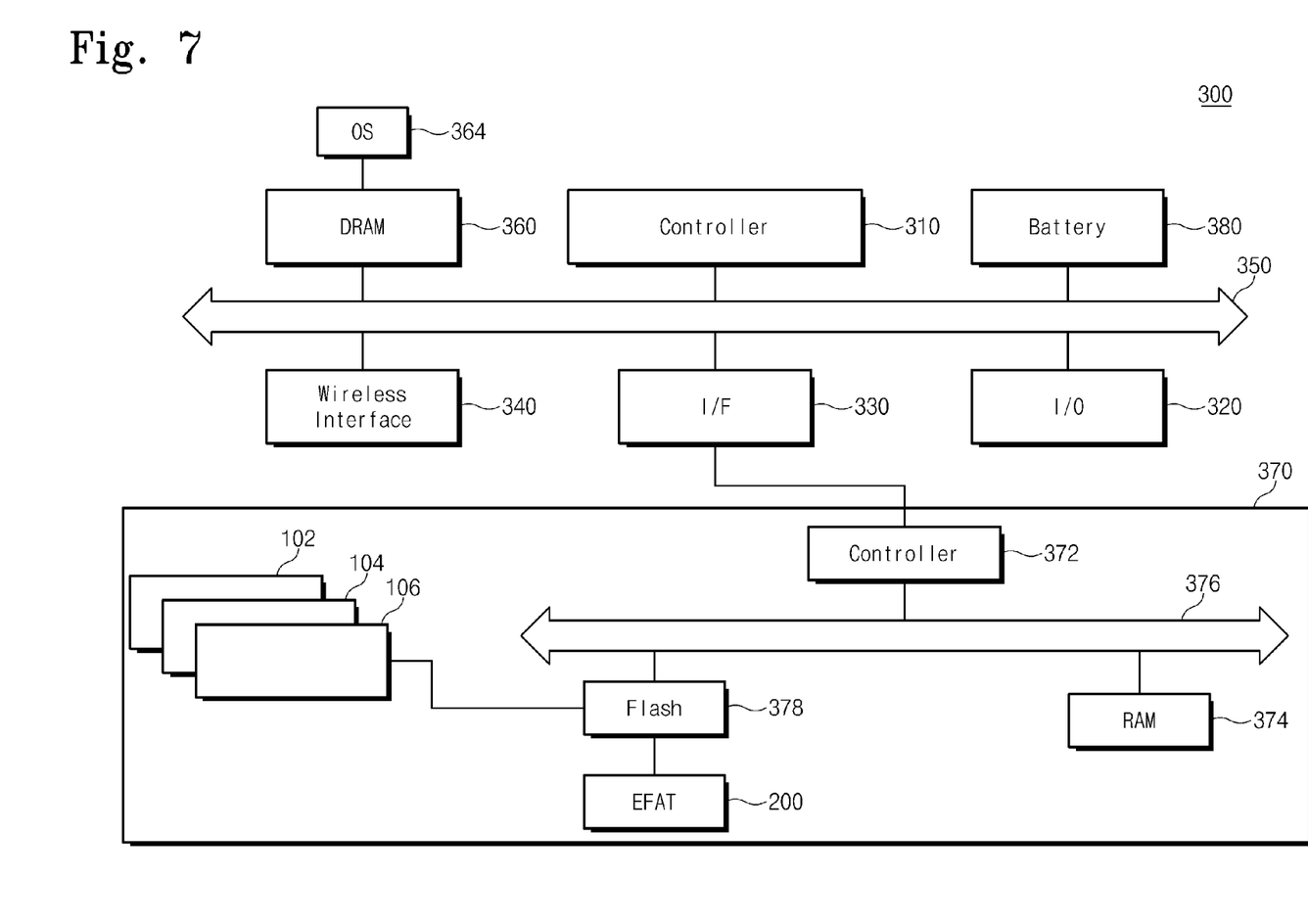
FIG. 7 is a block level diagram a system incorporating a NOR flash memory according to an embodiment of the inventive concept.

FIG. 7 is a block level diagram illustrating a system incorporating a NOR flash memory device according to an embodiment of the inventive concept.

Referring to FIG. 7, a system 300 is a process-based system and comprises a first bus 350, and a controller 310. The controller 310 communicates with the first bus 350. The controller 310 may include a micro controller, or at least one micro controller or digital signal processor. The system 300 receives a power supply through a battery 380. The system 300 may be a mobile terminal device, and is not limited thereto.

A dynamic random access memory (DRAM) 360 may be combined with the first bus 350, and performs functions of a system memory. After the system 300 is initialized, the DRAM 360 can store an operating system 564 such as Windows®

An input/output device 320 may be combined with the first bus 350, and may include various devices such as a touch screen, a display, a mouse, a keyboard, etc. A wireless interface 340 may be combined with the first bus 350. The wireless interface 340 can perform a cellular function or a communication function with a cellular function or other devices. For one example, the wireless interface 340 may include a dipole antenna.

The system 300 includes a memory 370. A flash memory 378 included in the memory 370 may store an emulated file allocation table 80 (EFAT) therein. The flash memory 378 may be a NOR flash memory as one example. The NOR flash memory realized according to the inventive concept may be applied as one example.

The memory 370 is connected to the first bus 350 through the interface 330. The memory 370 includes a second controller 372, a flash memory 378, and a RAM 374. The NOR flash memory 378 includes software 102, 104, and 106 for realizing the EFAT. Therefore, the EFAT 200 and the software 102, 104, and 106 are used for execution when being initialized.

In FIG. 7, the NOR flash memory device of the inventive concept is applied to a mobile terminal device as one example, and also can be applied to other various devices.

According to various embodiments of the inventive concept, the read operation speed of a flash memory may be improved by controlling a reference bias voltage generated from a reference memory cell, to be changed with a main word line voltage during a develop interval for the main word line voltage.

The above-disclosed subject matter is to be considered illustrative and not restrictive, and the appended claims are intended to cover all such modifications, enhancements, and other embodiments, which fall within the scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A flash memory device comprising:
   a memory cell array including a multi-level memory cell storing data;
   a reference bias voltage supply circuit configured to generate a reference bias voltage according to a reference word line voltage applied to a reference memory cell;
   a sense amplifier configured to sense the data stored in the memory cell in relation to the reference bias voltage; and
   a control circuit configured to control operation of the reference bias voltage supply circuit, such that the reference bias voltage is developed in accordance with a change in a main word line voltage applied to the memory cell during a read operation;
   wherein the read operation comprises a plurality of enable sub-intervals in which the main word line voltage is applied to the memory cell, and at least one of the plurality of enable sub-intervals encompasses a discharge sub-interval in which the reference word line voltage and the reference bias voltage are discharged while the main word line voltage is not discharged.

2. The flash memory device of claim 1, wherein the plurality of enable sub-intervals comprises sequentially occurring first, second and third enable sub-intervals, and the first and second enable sub-intervals include respectively a first discharge sub-interval and a second discharge sub-interval.

3. The flash memory device of claim 1, wherein the control circuit is further configured to control operation of the reference bias voltage supply circuit such that the reference bias voltage discharged during the discharge sub-interval is subsequently increased in accordance with a change in the voltage level of the main word line during a next enable sub-interval following the discharge sub-interval.

4. The flash memory device of claim 3, wherein a beginning of the next enable subinterval immediately follows an end of the discharge sub-interval.

5. The flash memory device of claim 1, wherein the reference bias voltage supply circuit comprises:
the reference memory cell;
a reference word line voltage supply circuit configured to supply the reference word line voltage to a gate of the reference memory cell; and
a reference bias voltage generation circuit connected to a drain of the reference memory cell and configured to generate the reference bias voltage,
wherein the reference word line voltage supply circuit comprises a discharge circuit configured to discharge the reference word line voltage during the discharge sub-interval, and a level of the reference bias voltage is changed in accordance with a change in a level of the reference word line voltage.

6. The flash memory device of claim 1, wherein the reference bias voltage supply circuit comprises:
the reference memory cell;
a reference word line voltage supply circuit configured to apply the reference word line voltage to a gate of the reference memory cell; and
a reference bias voltage generation circuit connected to a drain of the reference memory cell and configured to generate the reference bias voltage,
wherein the reference bias voltage generation circuit comprises a discharge circuit configured to discharge the reference bias voltage during the discharge sub-interval.

7. A method of reading multi-level data from a selected memory cell in a flash memory device, the method comprising:
applying a main word voltage to the selected memory cell during a read operation, wherein the main word line voltage is sequentially increased during each one of a plurality of enable sub-intervals;
generating a reference bias voltage according to a reference word line voltage applied to a reference memory cell, wherein the reference bias voltage is repeatedly developed at a predetermined level in accordance with an increase in the main word line voltage during each one of the plurality of sub-intervals; and
sensing the multi-level data stored in the selected memory cell using the reference bias voltage during each one of a plurality of data sense sub-intervals occurring during a respective one of the plurality of enable sub-intervals;
wherein the read operation comprises a plurality of enable sub-intervals in which the main word line voltage is applied to the memory cell, and at least one of the plurality of enable sub-intervals encompasses a discharge sub-interval in which the reference word line voltage and the reference bias voltage are discharged while the main word line voltage is not discharged.

8. The method of claim 7, further comprising:
during each one of the plurality of data sense sub-intervals, latching the sensed multilevel data.

9. The method of claim 8, further comprising:
following at least one of the plurality of data sense sub-intervals, discharging the reference bias voltage from the predetermined level down to a discharge level during the discharge sub-interval.

10. The method of claim 9, further comprising:
following the discharge sub-interval, re-developing the reference bias voltage at the predetermined level during a next enable sub-interval in the plurality of enable sub-intervals.

* * * * *